United States Patent
Lu et al.

(10) Patent No.: US 10,109,525 B1
(45) Date of Patent: Oct. 23, 2018

(54) FABRICATION METHOD AND STRUCTURE OF SEMICONDUCTOR DEVICE WITH CONTACT AND PLUG

(71) Applicant: United Microelectronics Corp., Hsinchu (TW)

(72) Inventors: Chia-Lin Lu, Taoyuan (TW); Chun-Lung Chen, Tainan (TW); Kun-Yuan Liao, Hsinchu (TW); Jiunn-Hsiung Liao, Tainan (TW); Wei-Hao Huang, New Taipei (TW); Kai-Teng Cheng, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/820,123

(22) Filed: Nov. 21, 2017

(51) Int. Cl.
*H01L 21/768* (2006.01)
*H01L 23/528* (2006.01)
*H01L 21/311* (2006.01)
*H01L 29/78* (2006.01)

(52) U.S. Cl.
CPC .. *H01L 21/76895* (2013.01); *H01L 21/31105* (2013.01); *H01L 21/7684* (2013.01); *H01L 21/76802* (2013.01); *H01L 21/76819* (2013.01); *H01L 21/76877* (2013.01); *H01L 23/5283* (2013.01); *H01L 29/785* (2013.01); *H01L 2029/7858* (2013.01)

(58) Field of Classification Search
CPC ......... H01L 21/31105; H01L 21/76802; H01L 21/76819; H01L 21/7684; H01L 21/76877; H01L 21/76895; H01L 23/5283; H01L 29/785

See application file for complete search history.

(56) References Cited

U.S. PATENT DOCUMENTS

| | | | |
|---|---|---|---|
| 6,184,138 B1 | 2/2001 | Ho et al. | |
| 6,221,754 B1 * | 4/2001 | Chiou | H01L 21/76877 257/E21.585 |
| 7,052,932 B2 | 5/2006 | Huang et al. | |
| 9,431,397 B2 | 8/2016 | Kuo et al. | |
| 2010/0330792 A1 * | 12/2010 | Kim | H01L 21/76895 438/586 |
| 2013/0181265 A1 | 7/2013 | Grasshoff et al. | |

* cited by examiner

*Primary Examiner* — Andrew Q Tran
(74) *Attorney, Agent, or Firm* — J.C. Patents

(57) ABSTRACT

A method for fabricating a semiconductor device is provided including providing a substrate, on which a plurality of elements is formed. A first inter-dielectric layer is formed over the substrate, covering the elements. A first plug structure is formed in the first inter-dielectric layer, including performing a polishing process over the first inter-dielectric layer to have a dishing on top and extending from a sidewall of the first plug structure. A hard mask layer is formed to fill the dishing. A second inter-dielectric layer is formed over the hard mask layer. A second plug structure is formed in the second inter-dielectric layer to electrically contact the first plug structure, wherein the second plug structure has at least an edge portion extending on the hard mask layer.

20 Claims, 7 Drawing Sheets

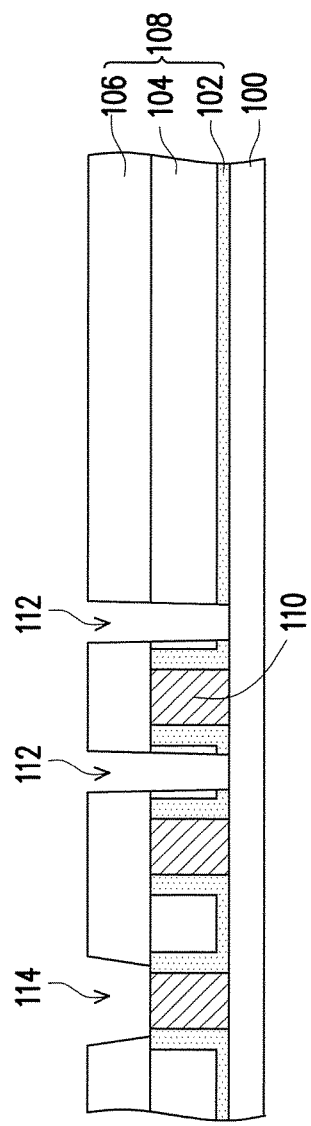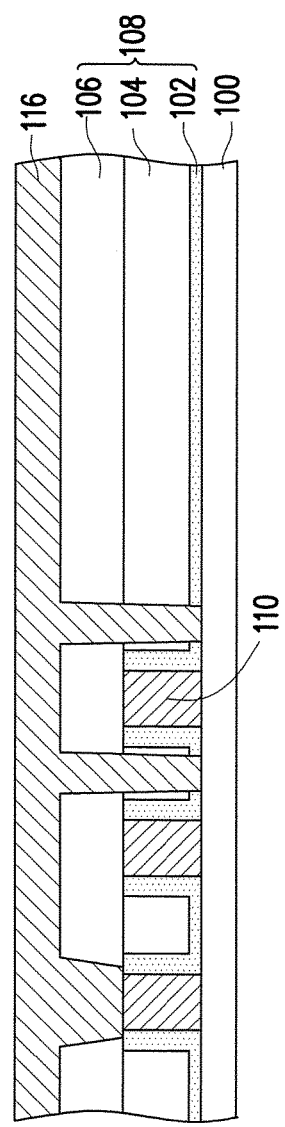

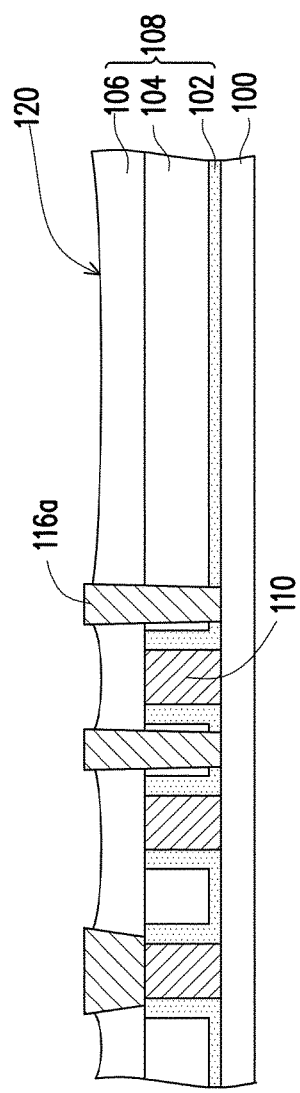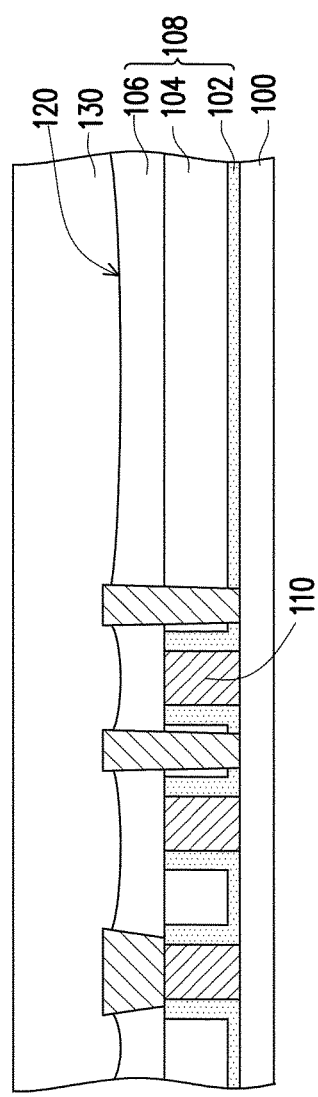
FIG. 8
FIG. 9

FABRICATION METHOD AND STRUCTURE OF SEMICONDUCTOR DEVICE WITH CONTACT AND PLUG

BACKGROUND

1. Field of the Invention

The present invention generally relates to semiconductor fabrication, and particularly to method for fabricating a semiconductor device, involving formation of contact plug and via plug, connected together in vertical direction.

2. Description of Related Art

In an integrated circuit, usually, various devices such as transistors have already been formed on the substrate. The devices at the lower part usually need to connect to the other part of the circuit at higher level. In this situation, a vertical connection structure, such as via plug or contact plug, in different level is formed to have the connection in vertical direction.

The process to form the contact or via usually needs to form an inter-dielectric layer first. Then, the opening in the inter-dielectric layer is formed. The metal material is disposed over the inter-dielectric layer to fill the opening, and then polishing the metal material to form the metal plug, which generally can be the contact or via. The contact plug usually refers to the plug contacting the elements on the substrate at the lower level. The via plug usually refers to the plug contacting the interconnection at the higher level. However, it can be generally referred as the lower plug and the upper plug.

Conventionally, when the inter-dielectric layer at the higher level is disposed on the inter-dielectric layer at the lower level. The inter-dielectric layer at the higher level is patterned to have the via opening to expose the contact plug. In this situation, since the materials of the inter-dielectric layers at the higher level and the lower level are dielectric material, the etching process for the via opening may over etch the inter-dielectric layer at the lower level. An indent of the inter-dielectric layer at the lower level along the edge of the via opening, outside from the contact, would usually occur.

SUMMARY OF THE INVENTION

In an embodiment of the invention, a method for fabricating a semiconductor device is provided comprising providing a substrate, on which a plurality of elements is formed. A first inter-dielectric layer is formed over the substrate, covering the elements. A first plug structure is formed in the first inter-dielectric layer, including performing a polishing process over the first inter-dielectric layer to have a dishing on top and extending from a sidewall of the first plug structure. A hard mask layer is formed to fill the dishing. A second inter-dielectric layer is formed over the hard mask layer. A second plug structure is formed in the second inter-dielectric layer to electrically contact the first plug structure, wherein the second plug structure has at least an edge portion extending on the hard mask layer.

In an embodiment, as to the fabrication of the semiconductor device, the hard mask layer serves as an etching stop layer, when the second inter-dielectric layer is patterned to have an opening to expose the first plug structure in the first inter-dielectric layer.

In an embodiment, as to the fabrication of the semiconductor device, the step of forming the first plug structure comprises patterning the first inter-dielectric layer to have a first opening to expose the substrate, disposing a metal layer over the first inter-dielectric layer to fill the first opening, and polishing the metal layer to expose the first inter-dielectric layer to form the first plug structure. The first inter-dielectric layer is over polished to have the dishing lower than a top of the first plug structure.

In an embodiment, as to the fabrication of the semiconductor device, the step of forming the hard mask layer comprises forming a preliminary hard mask layer over the first inter-dielectric layer to at least fill the dishing, and polishing the preliminary hard mask layer to expose the top of the first plug structure. A remaining portion of the preliminary hard mask layer forms the hard mask layer to fill the dishing to provide an additional capability of etching stop.

In an embodiment, as to the fabrication of the semiconductor device, the step of forming the second plug structure comprises forming a stop layer over the first plug structure and the hard mask layer, forming an oxide layer on the stop layer, patterning the oxide layer and the stop layer to have a second opening in the oxide layer and the stop layer to expose the first plug structure. At least a portion of an edge of the second opening is extending on the hard mask layer, and filling a metal material into the second opening to form the second plug structure.

In an embodiment, as to the fabrication of the semiconductor device, the oxide layer and the stop layer are etched by different etchants.

In an embodiment, as to the fabrication of the semiconductor device, a geometric shape of the first plug structure at a transverse cross-section is bar-like and a geometric shape of the second plug structure at a transverse cross-section is round, square, or rectangular.

In an embodiment, as to the fabrication of the semiconductor device, the first plug structure is between elements foil red on the substrate and is higher than the elements.

In an embodiment, as to the fabrication of the semiconductor device, the elements comprise gate structures, and the gate structures on the substrate as provided are gate lines over a fin structure in a fin field effect transistor.

In an embodiment, as to the fabrication of the semiconductor device, the hard mask layer effectively stops the etching process during an etching effect on the second inter-dielectric layer during forming the second plug structure.

In an embodiment of the invention, a semiconductor device comprises a substrate, on which a plurality of elements is formed. A first inter-dielectric layer is disposed over the substrate, covering the elements. A first plug structure is formed in the first inter-dielectric layer, wherein the first inter-dielectric layer has a dishing on top and extending from a sidewall of the first plug structure. A hard mask layer fills the dishing. A second inter-dielectric layer is at least disposed over the hard mask layer. A second plug structure is formed in the second inter-dielectric layer to electrically contact the first plug structure. The second plug structure has at least an edge portion extending on the hard mask layer.

In an embodiment, as to the fabrication of the semiconductor device, the hard mask layer serves as an etching stop layer with respect to an opening in the second inter-dielectric layer to expose the first plug structure in the first inter-dielectric layer.

In an embodiment, as to the fabrication of the semiconductor device, the first inter-dielectric layer has a first opening to expose the substrate, and a metal layer fills the first opening to form the first plug structure, wherein the first inter-dielectric layer has the dishing lower than a top of the first plug structure.

In an embodiment, as to the fabrication of the semiconductor device, the hard mask layer fills the dishing, wherein the first plug structure and the hard mask layer (130a) are substantially same height, wherein the hard mask layer filling the dishing provides a stop capability of etching.

In an embodiment, as to the fabrication of the semiconductor device, the second inter-dielectric layer comprises a stop layer disposed over the first plug structure and the hard mask layer, and an oxide layer disposed on the stop layer. A second opening in the oxide layer and the stop layer exposes the first plug structure, wherein the second opening adapts the second plug structure. At least a portion of an edge of the second opening is extending on the hard mask layer.

In an embodiment, as to the fabrication of the semiconductor device, a material of the stop layer is different from a material of the oxide layer, so to have a sufficient etching selectivity to the oxide layer.

In an embodiment, as to the fabrication of the semiconductor device, a geometric shape of the first plug structure at a transverse cross-section is bar-like and a geometric shape of the second plug structure at a transverse cross-section is round, square, or rectangular.

In an embodiment, as to the fabrication of the semiconductor device, the first plug structure is between elements formed on the substrate and is higher than the elements.

In an embodiment, as to the fabrication of the semiconductor device, the elements comprise gate structures, and the gate structures on the substrate as provided are gate lines over a fin structure in a fin field effect transistor.

In an embodiment, as to the fabrication of the semiconductor device, the hard mask layer has an etching selectivity being effectively lower than that of the second inter-dielectric layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 to FIG. 12 are drawings, schematically illustrating a method for fabricating a semiconductor device for multiple levels of plug structures, according to an embodiment of the invention.

DESCRIPTION OF THE EMBODIMENTS

The invention is directed to structure and fabrication method for semiconductor structure with multiple levels of plug structures, which are connected together in vertical device. The occurrence of a tiger tooth structure, as seen in a cross-section view, at the edge of the upper-level plug can be reduced.

Multiple embodiments are provided for describing the invention. However, the invention is not limited to the embodiments as provided. Further, a proper combination between the embodiments may be taken to form another embodiment.

An issue as concerned in fabricating semiconductor device, including the occurrence of tiger-tooth structure in a cross-section view, has at least considered to be reduced. The mechanism to form the tiger-tooth structure is first described as investigated in the invention.

Figure 1:
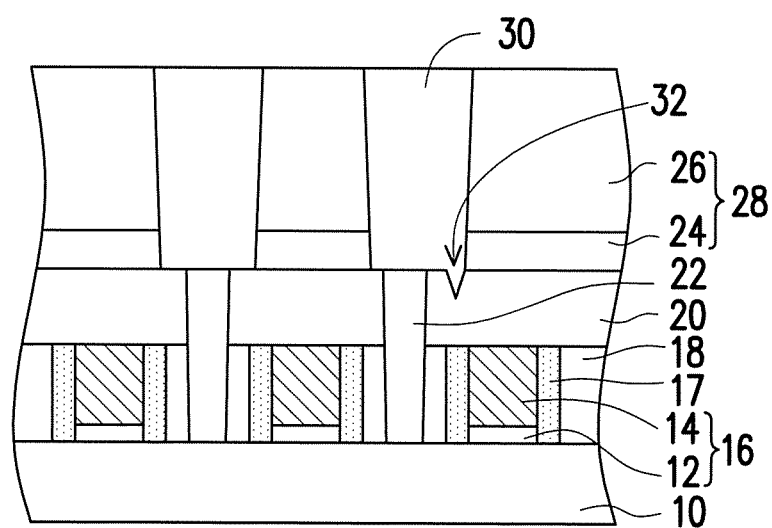
FIG. 1 is a drawing, schematically illustrating a concerning issue of tiger tooth potentially formed in a semiconductor device during fabrication as viewed in a cross-section structure, according to an embodiment of the invention.
Figure 2:
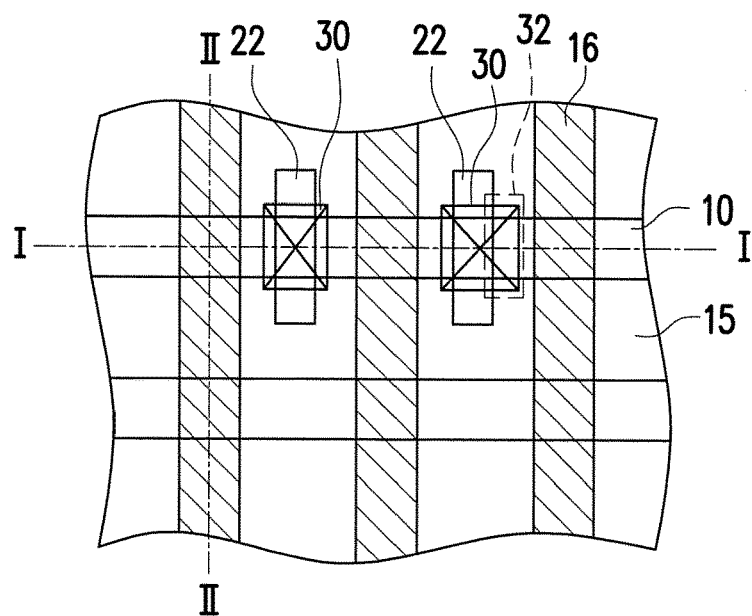
FIG. 2 is a drawing, schematically illustrating a top view for a contact and a plug structure for a fin field effect transistor (FET), connected together in vertical direction, according to an embodiment of the invention.
Figure 3:
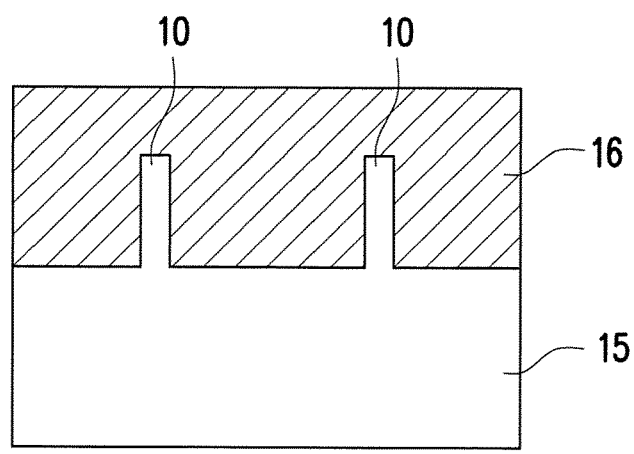
FIG. 3 is a drawing, schematically illustrating a cross-sectional structure along a cut line II-II in FIG. 2, according to an embodiment of the invention.

FIG. 1 is a drawing, schematically illustrating a concerning issue of tiger tooth potentially formed in a semiconductor device during fabrication as viewed in a cross-section structure, according to an embodiment of the invention. FIG. 2 is a drawing, schematically illustrating a top view for a contact and a plug structure for a fin field effect transistor (FET), connected together in vertical direction, according to an embodiment of the invention. FIG. 3 is a drawing, schematically illustrating a cross-sectional structure along a cut line II-II in FIG. 2, according to an embodiment of the invention.

In an embodiment for taking fin FET as an example, it can associate with the structure as shown in FIG. 2 and FIG. 3. FIG. 1 is the cross-sectional structure, cutting on the line I-I in FIG. 2, as an example. Multiple elements 16 have already been formed on a substrate 10. The substrate 10 may generally have already been formed with other structures. Here taking fin FET as an example, substrate 10 in an embodiment can be a fin structure fabricated on a wafer 15, as seen in FIGS. 2 and 3. The wafer 15 can be patterned to have multiple fins 10, the gate structures as a gate-structure line shown by element 16 can be formed, crossing over multiple fins 10. The gate-structure line in an embodiment can be generally represented by the elements 16 for serving as the gate structure of a FET. In this situation, the element 16 would include the gate oxide layer 12 and the gate conductive layer 14, or even further include the spacer 17 at the side wall of the gate conductive layer 14. The location of the element 16 in crossing over the fins 10 forms a fin FET, as known in the art. A detail of descriptions is not further provided here.

Then, in order to connect the element 16 to a predetermined terminal of the circuit layer at the higher level, a vertical interconnection structure basically formed by contact and via at different level needs to be formed between the elements 16.

Multiple inter-dielectric layers 18 and 20, stacked as an inter-dielectric layer are formed over the element 16. A contact structures 22 are formed in the inter-dielectric layers 18 and 20 to electrically connect to a terminal at the substrate 30 relating to the element 16. The contact structures 22 can also be generally referred as the plug structure, which contacts the substrate 10. However, the terminal such as a drain region of a FET at the substrate 10 relating to the element 16 such as a gate structure may need to connect to the circuit layer at even higher level, a further plug structure 30 should be formed on the contact structure 22. The term "plug" is not intended to limit its geometric shapes. For example, geometric shape of the plug structure at a transverse cross-section may be bar-like, round, square, or rectangular.

To form the plug structure 30, it needs to form another inter-dielectric layer 28 on the inter-dielectric layer 20. The inter-dielectric layer 28 may include a stop layer 24 and an oxide layer 26. The plug structure 30 is formed in the inter-dielectric layer 28 to electrically connect to the contact structure 22. In fabricating the plug structure 30, the oxide layer 26 is patterned to have the first stage opening with a first etchant. The first stage opening would stop on the stop layer 24. Then, another etchant can be taken to etch the stop layer 24 to expose the contact structure 22. Then, the metal material can be filled into the opening to form the plug structure 30, electrically connecting to the contact structure 22. As previously stated, the contact structure 22 is also a plug structure. As a result, the completed plug structure is formed by stacking the contact structure 22 and the plug structure 30.

In the above example as concerned in the invention, since the edge portion 32 of the plug structure 30 as shown in FIG. 2 in top view is extending out from the contact structure 22. In the cross-section view at the edge 32 of the plug structure 30, a sharp protruding structure, like a tiger tooth, may easily occur due to the etching defect to the inter-dielectric layer 20 while the opening in the inter-dielectric layer 28 is formed by etching process. After the plug structure 30 fills into the opening, the tiger-tooth-like structure, as seen in cross-section, occurs.

After investigating the mechanism causing the tiger tooth structure, embodiments of the invention have proposed the fabrication process, at least effectively reducing the occurrence of tiger tooth structure.

FIG. 4 to FIG. 12 are drawings, schematically illustrating a method for fabricating a semiconductor device for multiple levels of plug structures, according to an embodiment of the invention.

Figure 4:
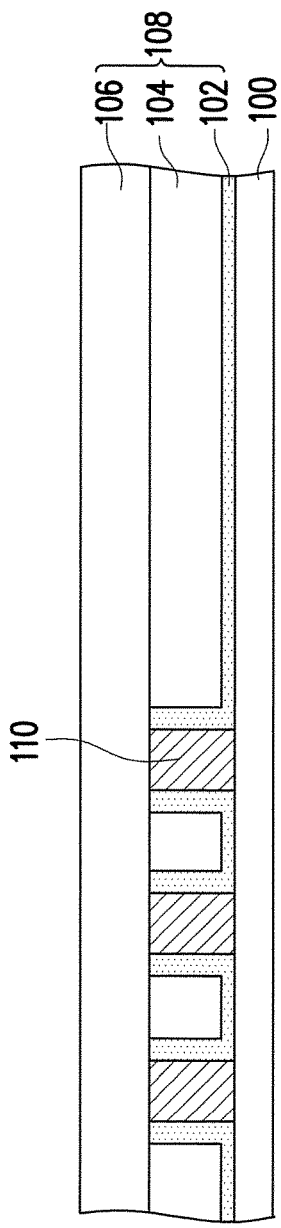

Referring to FIG. 4, a substrate 100 is provided. There are elements 110 formed on the substrate 100 already. Here, the elements 110 can be a gate structure of a FET or any protruding structure of a device without limiting to a specific part. In other word, the element 110 may include a stacked of gate oxide layer, gate electrode, and a cap layer, in an example. However, taking the gate structure as an example for the element 110 of a FET, a dielectric layer 102 such as silicon nitride layer to form the spacer of the element 110 at the end structure is formed. A dielectric layer 104 such as oxide layer is further formed on the dielectric layer 102, surrounding the element 110 and providing a flat surface for subsequent fabrication processes in an example. Another dielectric layer 106 for forming another circuit layer is subsequently formed on the dielectric layer 104. The dielectric layer 102, the dielectric layer 104 and the dielectric layer 106 together is generally referred as an inter-dielectric layer 108.

Figure 5:
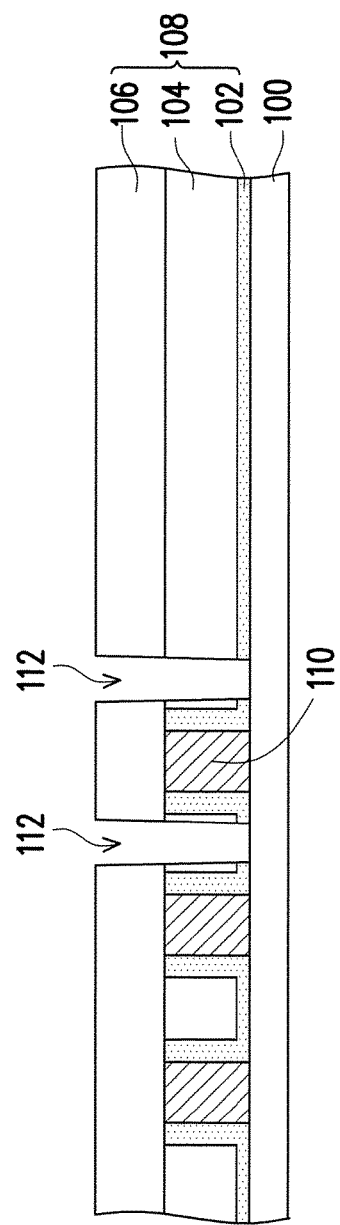

Referring to FIG. 5, the inter-dielectric layer 108 is patterned to form an opening 112 to expose the substrate 100 at the region, which can be the source or drain region relating to the element 110 such as a gate structure of a FET, in an example. Referring to FIG. 6, another opening 114 may also just formed in the dielectric layer 106 to expose a corresponding one of the elements 110 but not the substrate.

Referring to FIG. 7, a metal layer 116 is formed over the inter-dielectric layer 108 to fill the opening 112 and the opening 114. Referring to FIG. 8, the metal layer 116 is polished by chemical mechanical polishing (CMP) process as an example to expose the inter-dielectric layer 108. The remaining portion of the metal layer 116 filling into the opening 112 becomes a plug structure 116a, which contacts the substrate 100. Another plug structure filling into the opening 114 is contacting the element 110.

It should be noted that the polishing process is over polishing the dielectric layer 106 of the inter-dielectric layer 108 to have a dishing 120, which extends from the sidewall of the plug structure 116a. In other word, the plug structure 116a significantly protrudes out from the inter-dielectric layer 108 after the polishing process.

Since the region relating to the element 110 at the substrate need to be connected to the circuit at further higher level, another plug structure needs to be formed, subsequently. An issue about occurrence of tiger tooth as described in FIG. 1 may occur when another plug structure is formed on the plug structure 116a in the usual subsequent process, as investigated in FIG. 1. The dishing 120 produce the effect to reduce the occurrence of tiger tooth as to be seen in the following descriptions.

Figure 10:
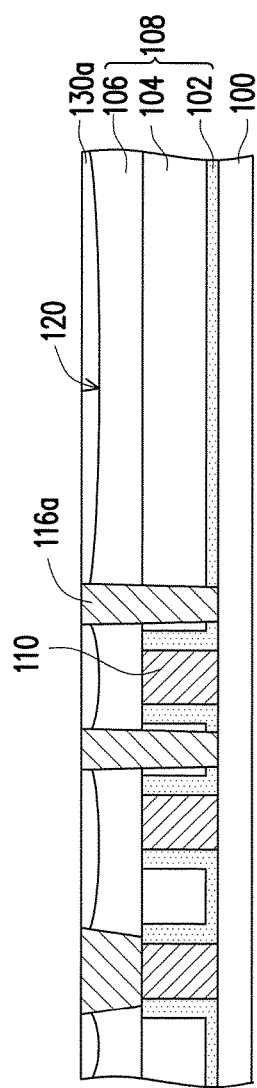

Referring to FIG. 9, a dielectric layer 130 (preliminary hard mask layer), such as silicon nitride (SiN), silicon oxynitride (SiON), silicon carbide (SiC), nitrogen-doped silicon carbide (NDC or SiCN), silicon boron carbon nitride (SiBCN), silicon carbon oxynitride (SiOCN), hafnium oxide (HfO), any suitable high-K material with a dielectric constant higher than 4.0, or a combination thereof, is formed over the inter-dielectric layer 108, which has the dishing 120 at the current stage. The dielectric layer 130 may be formed by atomic layer deposition (ALD) process or chemical vapor deposition (CVD) process. Referring to FIG. 10, Another polishing process is performed on the dielectric layer 130 to expose the plug structure 116a, in which the remaining portion of the dielectric layer 130 filling into the dishing 120 becomes a hard mask layer 130a, which can serve as an etching stop layer to prevent the dielectric layer 106 of the inter-dielectric layer 108 from being etched while another plug structure is formed at the higher level. The hard mask layer 130a may have a flat top surface and a curved bottom surface.

Figure 11:
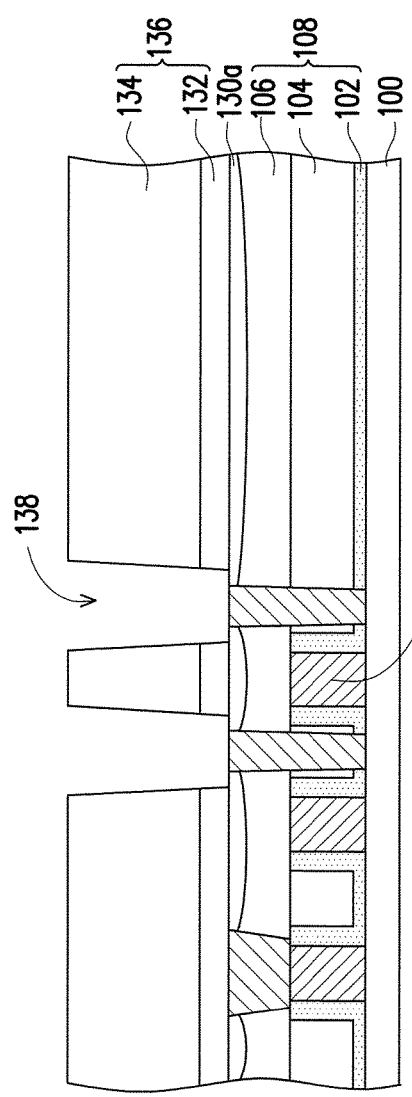

Referring to FIG. 11, an inter-dielectric layer 136, including a stack of an etching stop layer 132 and a dielectric layer 134, is formed over the substrate 100 to cover the plug structure 116a and the hard mask layer 130a. The inter-dielectric layer 136 is patterned to have an opening 138 to expose the plug structure 116a and a portion of the hard mask layer 130a. The etching stop layer 132 may be formed of the material as used in dielectric layer 130, preferably nitrogen-doped silicon carbide (SiCN).

In an embodiment, the etching stop layer 132 and the hard mask layer 130a may use different materials. Here, even if the sidewall of the opening 138 extends to the hard mask layer 130a such as silicon nitride (SiN), the hard mask layer 130a can effectively resist the etching process while the opening 138 is formed by the etching process. The etching process may include two stages. The first stage of etching with a first etchant is to etch the dielectric layer 134, such as the oxide layer, and stops at the etching stop layer 132 such as nitrogen-doped silicon carbide (SiCN). The second stage with a second etchant is to etch the etching stop layer 132, so to expose the plug structure 116a. In the situation, the hard mask layer 130a can provide sufficient capability of etching stop with respect to the etching stop layer 132.

In an alternative embodiment, the etching stop layer 132 and the hard mask layer 130a may also use the same material, such as nitrogen-doped silicon carbide (SiCN). When an etchant is used to etch the etching stop layer 132, so to expose the plug structure 116a, the hard mask layer 130a can also prevent the inter-dielectric layer 108 from being etched.

Figure 12:
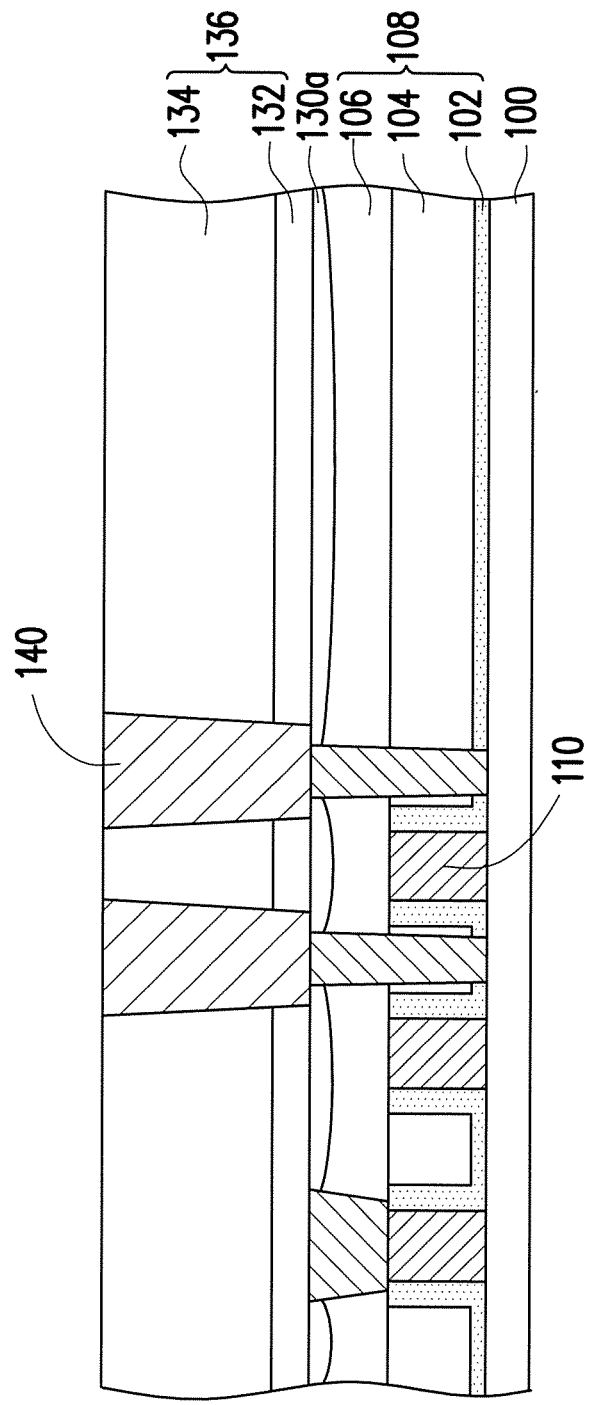

Referring to FIG. 12, the plug structure 140 is formed to fill into the opening 138. The plug structure 140 electrically contacts the plug structure 116a at the lower level. As usually known, another inter-connection layer can be subsequently formed on the inter-dielectric layer 136, but not further described here. The occurrence of tiger tooth structure as stated in FIG. 1 can be effectively reduced.

In the embodiment, the plug structure 140 in current stage of the semiconductor device as shown in FIG. 12 has no tiger tooth. This would improve the quality of the semiconductor device. In an embodiment, the technology about the dishing 120 with the hard mask layer 130a can be generally applied to the connection in stack manner for adjacent the plug structures. The invention is not specifically limited to the substrate 100 and the element 110 on the substrate 100. The substrate 100 can be silicon substrate, fin structure, a circuit substrate, or any structural substrate. The element 110 can be a structure part of the whole semiconductor device.

The embodiments of the invention propose the dishing 120 with hard mask layer 130a, so to provide a flat working plane for the subsequent formation of the plug structure. The occurrence of tiger tooth can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a semiconductor device, comprising:
   providing a substrate, on which a plurality of elements is formed;
   forming a first inter-dielectric layer over the substrate, covering the elements;
   forming a first plug structure in the first inter-dielectric layer, including performing a polishing process over the first inter-dielectric layer to have a dishing on top and extending from a sidewall of the first plug structure;
   forming a hard mask layer, filling the dishing;
   forming a second inter-dielectric layer, over the hard mask layer; and
   forming a second plug structure in the second inter-dielectric layer to electrically contact the first plug structure, wherein the second plug structure has at least an edge portion extending on the hard mask layer.

2. The method of claim 1, wherein the hard mask layer serves as an etching stop layer, when the second inter-dielectric layer is patterned to have an opening to expose the first plug structure in the first inter-dielectric layer.

3. The method of claim 1, wherein the step of forming the first plug structure comprises:
   patterning the first inter-dielectric layer to have a first opening to expose the substrate;
   disposing a metal layer over the first inter-dielectric layer to fill the first opening; and
   polishing the metal layer to expose the first inter-dielectric layer to form the first plug structure, wherein the first inter-dielectric layer is over polished to have the dishing lower than a top of the first plug structure.

4. The method of claim 3, wherein the step of forming the hard mask layer comprises:
   forming a preliminary hard mask layer over the first inter-dielectric layer to at least fill the dishing; and
   polishing the preliminary hard mask layer to expose the top of the first plug structure, wherein a remaining portion of the preliminary hard mask layer forms the hard mask layer filling the dishing to provide an additional capability of etching stop.

5. The method of claim 4, wherein the step of forming the second plug structure comprises:
   forming a stop layer over the first plug structure and the hard mask layer;
   forming an oxide layer on the stop layer;
   patterning the oxide layer and the stop layer to have a second opening in the oxide layer and the stop layer to expose the first plug structure, wherein at least a portion of an edge of the second opening is extending on the hard mask layer; and
   filling a metal material into the second opening to form the second plug structure.

6. The method of claim 5, wherein the oxide layer and the stop layer are etched by different etchants.

7. The method of claim 1, wherein a geometric shape of the first plug structure at a transverse cross-section is bar-like and a geometric shape of the second plug structure at a transverse cross-section is round, square, or rectangular.

8. The method of claim 1, wherein the first plug structure is between elements formed on the substrate and is higher than the elements.

9. The method of claim 1, wherein the elements comprise gate structures, and the gate structures on the substrate as provided are gate lines over a fin structure in a fin field effect transistor.

10. The method of claim 1, wherein the hard mask layer effectively stops the etching process during an etching effect on the second inter-dielectric layer during forming the second plug structure.

11. A semiconductor device, comprising:
   a substrate, on which a plurality of elements is formed;
   a first inter-dielectric layer, disposed over the substrate, covering the elements;
   a first plug structure, formed in the first inter-dielectric layer, wherein the first inter-dielectric layer has a dishing on top and extending from a sidewall of the first plug structure;
   a hard mask layer, filling the dishing;
   a second inter-dielectric layer, at least disposed over the hard mask layer; and
   a second plug structure, formed in the second inter-dielectric layer to electrically contact the first plug structure, wherein the second plug structure has at least an edge portion extending on the hard mask layer.

12. The semiconductor device of claim 11, wherein the hard mask layer serves as an etching stop layer with respect to an opening in the second inter-dielectric layer to expose the first plug structure in the first inter-dielectric layer.

13. The semiconductor device of claim 11, wherein the first inter-dielectric layer has a first opening to expose the substrate, and a metal layer fills the first opening to form the first plug structure, wherein the first inter-dielectric layer has the dishing lower than a top of the first plug structure.

14. The semiconductor device of claim 13, wherein the hard mask layer fills the dishing, wherein the first plug structure and the hard mask layer are substantially same height, wherein the hard mask layer filling the dishing provides a stop capability of etching.

15. The semiconductor device of claim 14, wherein the second inter-dielectric layer comprises:
   a stop layer, disposed over the first plug structure and the hard mask layer; and
   an oxide layer, disposed on the stop layer,
   wherein a second opening in the oxide layer and the stop layer exposes the first plug structure, wherein the second opening adapts the second plug structure, wherein at least a portion of an edge of the second opening is extending on the hard mask layer.

16. The semiconductor device of claim 15, wherein a material of the stop layer is different from a material of the oxide layer, so to have a sufficient etching selectivity to the oxide layer.

17. The semiconductor device of claim 11, wherein a geometric shape of the first plug structure at a transverse cross-section is bar-like and a geometric shape of the second plug structure at a transverse cross-section is round, square, or rectangular.

18. The semiconductor device of claim 11, wherein the first plug structure is between elements formed on the substrate and is higher than the elements.

19. The semiconductor device of claim 11, wherein the elements comprise gate structures, and the gate structures on the substrate as provided are gate lines over a fin structure in a fin field effect transistor.

20. The semiconductor device of claim 11, wherein the hard mask layer has an etching selectivity being effectively lower than that of the second inter-dielectric layer.

* * * * *